(12) United States Patent
Coffy et al.

(10) Patent No.: US 11,676,928 B2
(45) Date of Patent: Jun. 13, 2023

(54) ELECTRONIC DEVICE INCLUDING ELECTRICAL CONNECTIONS ON AN ENCAPSULATION BLOCK

(71) Applicants: STMicroelectronics (Grenoble 2) SAS, Grenoble (FR); STMicroelectronics (Alps) SAS, Grenoble (FR)

(72) Inventors: Romain Coffy, Voiron (FR); Patrick Laurent, Tullins (FR); Laurent Schwartz, La buisse (FR)

(73) Assignees: STMicroelectronics (Grenoble 2) SAS, Grenoble (FR); STMicroelectronics (Alps) SAS, Grenoble (FR)

( * ) Notice: Subject to any disclaimer, the term of this patent is extended or adjusted under 35 U.S.C. 154(b) by 124 days.

(21) Appl. No.: 17/396,346

(22) Filed: Aug. 6, 2021

(65) Prior Publication Data

US 2021/0366865 A1     Nov. 25, 2021

Related U.S. Application Data

(62) Division of application No. 16/704,082, filed on Dec. 5, 2019, now Pat. No. 11,114,404.

(30) Foreign Application Priority Data

Dec. 12, 2018   (FR) ...................................... 1872789

(51) Int. Cl.
*H01L 23/00* (2006.01)
*H01L 21/56* (2006.01)
*H01L 23/31* (2006.01)

(52) U.S. Cl.
CPC .............. *H01L 24/24* (2013.01); *H01L 21/56* (2013.01); *H01L 23/3185* (2013.01);
(Continued)

(58) Field of Classification Search
None
See application file for complete search history.

(56) References Cited

U.S. PATENT DOCUMENTS

2013/0056247 A1   3/2013   Yoshioka et al.
2013/0277824 A1   10/2013  Mahler et al.
(Continued)

FOREIGN PATENT DOCUMENTS

JP        2016037546 A      3/2016

OTHER PUBLICATIONS

INPI Search Report and Written Opinion for FR 1872789 dated Oct. 15, 2019 (10 pages).

*Primary Examiner* — Evren Seven
(74) *Attorney, Agent, or Firm* — Crowe & Dunlevy

(57) ABSTRACT

An integrated circuit chip includes a front face having an electrical connection pad. An overmolded encapsulation block encapsulates the integrated circuit chip and includes a front layer at least partially covering a front face of the integrated circuit chip. A through-hole the encapsulation block is located above the electrical connection pad of the integrated circuit chip. A wall of the through-hole is covered with an inner metal layer that is joined to the front pad of the integrated circuit chip. A front metal layer covers a local zone of the front face of the front layer, with the front metal layer being joined to the inner metal layer to form an electrical connection. The inner metal layer and the front metal layer are attached or anchored to activated additive particles that are included in the material of the encapsulation block.

10 Claims, 3 Drawing Sheets

(52) U.S. Cl.
CPC ............ *H01L 24/05* (2013.01); *H01L 24/16* (2013.01); *H01L 24/73* (2013.01); *H01L 24/82* (2013.01); *H01L 2224/0233* (2013.01); *H01L 2224/02315* (2013.01); *H01L 2224/02381* (2013.01); *H01L 2224/16145* (2013.01); *H01L 2224/24011* (2013.01); *H01L 2224/24105* (2013.01); *H01L 2224/24137* (2013.01); *H01L 2224/24195* (2013.01); *H01L 2224/24226* (2013.01); *H01L 2224/73227* (2013.01); *H01L 2224/73265* (2013.01); *H01L 2224/73267* (2013.01); *H01L 2224/82048* (2013.01); *H01L 2224/82108* (2013.01)

(56) References Cited

U.S. PATENT DOCUMENTS

| | | |
|---|---|---|
| 2014/0182887 A1 | 7/2014 | Yoshioka et al. |
| 2020/0144179 A1 | 5/2020 | Chen et al. |

ELECTRONIC DEVICE INCLUDING ELECTRICAL CONNECTIONS ON AN ENCAPSULATION BLOCK

CROSS REFERENCE TO RELATED APPLICATION

This application is a divisional of U.S. patent application Ser. No. 16/704,082, filed Dec. 5, 2019, which claims the priority benefit of French Application for Patent No. 1872789, filed on Dec. 12, 2018, the contents of which are hereby incorporated by reference in their entireties to the maximum extent allowable by law.

TECHNICAL FIELD

Embodiments relate to electronic devices comprising integrated circuit chips and carrier substrates for integrated circuit chips.

BACKGROUND

Generally, in such electronic devices, the integrated circuit chip is connected to the carrier substrate by electrical wires or by electrical connection elements interposed between them, the integrated circuit chip and the electrical wires or the electrical connection elements being embedded in an encapsulation block in front of the carrier substrate. In the case of superposed integrated circuit chips, the electrical connections are also made by electrical wires or interposed electrical connection elements.

SUMMARY

According to one embodiment, an electronic device comprises an integrated circuit chip, a front face of which is provided with at least one electrical connection pad, and an overmolded encapsulation block encapsulating the integrated circuit chip comprising a front layer at least partially covering the front face of the integrated circuit chip.

The encapsulation block comprises a plastic material containing additive particles and has a through-hole above the pad of the integrated circuit chip.

The wall of the hole is covered with an inner metal layer that is joined to the front pad of the integrated circuit chip and a local zone of the front face of the overmolded encapsulation block running up to the hole is covered with a local front metal layer that is joined to the inner metal layer so as to form an electrical connection.

The inner metal layer and the local front metal layer are attached or anchored to additive particles included in the material of the encapsulation block.

By virtue of the above arrangements, electrical connections are made directly and straightforwardly and may be short.

At least part of the periphery of the edge of the hole in the front layer of the encapsulation block, located on the integrated circuit chip side, may be above and adjacent to a front face of the pad of the integrated circuit chip.

The front layer of the encapsulation block may partially cover a front face of the front pad.

The edge of the hole in the front layer of the encapsulation block, located on the integrated circuit chip side, may be inscribed above a front face of the pad of the integrated circuit chip.

A back face of the integrated circuit chip may be attached to the top of a front face of a carrier substrate.

The overmolded encapsulation block may comprise an annular peripheral portion that runs around the periphery of the integrated circuit chip, on top of the front face of the carrier substrate.

The annular peripheral portion of the overmolded encapsulation block may have a through-hole, the wall of which is covered with an inner metal layer that is connected to an electrical connection pad of the front face of the carrier substrate and to said local front metal layer so as to form an electrical connection between the front pad of the integrated circuit chip and the front pad of the carrier substrate.

An additional electronic component may be mounted on top of the front face of the carrier substrate, a certain distance away from the integrated circuit chip, and is embedded in the overmolded encapsulation block.

The annular peripheral portion of the overmolded encapsulation block may have a through-hole that is located above the second electrical component, the wall of which is covered with an inner metal layer that is connected to an electrical connection pad of a front face of the second electronic component and to the local front metal layer.

An electrical connection may thus be formed between the front pad of the integrated circuit chip and the front pad of the carrier substrate, the inner metal layer being attached or anchored to additive particles included in the material of the encapsulation block.

An additional electronic component may be mounted on top of the front layer of the overmolded encapsulation block via at least one electrical connection element that is interposed between the local front metal layer and a pad of the electronic component.

A process for fabricating an electronic device is also proposed, which process comprises: placing, in a mold, an integrated circuit chip having a front face provided with at least one electrical connection pad; and injecting, into the mold, a material provided with additive particles that can be activated by laser radiation so as to produce, by overmolding, an encapsulation block comprising a layer at least partially covering said face of the integrated circuit chip; then, after removing the obtained device from the mold: making a hole in the layer of the encapsulation block above the pad of the integrated circuit chip and activating the additive particles that are located in the wall of the hole and in a local zone of the front face of the front layer running up to the hole under the effect of laser radiation; and producing, in a metal bath, a metallization phase so as to form, under the effect of the activated particles, an inner metal layer that is attached or anchored to the wall of the hole and connected to the front pad of the integrated circuit chip, and a local front metal layer that is attached or anchored to the front local zone of the front face of the layer of the encapsulation block and connected to the inner metal layer of the hole.

BRIEF DESCRIPTION OF THE DRAWINGS

Electronic devices and their modes of fabrication will now be described by way of non-limiting exemplary embodiments illustrated in the appended drawing, in which.

DETAILED DESCRIPTION

Figure 1:
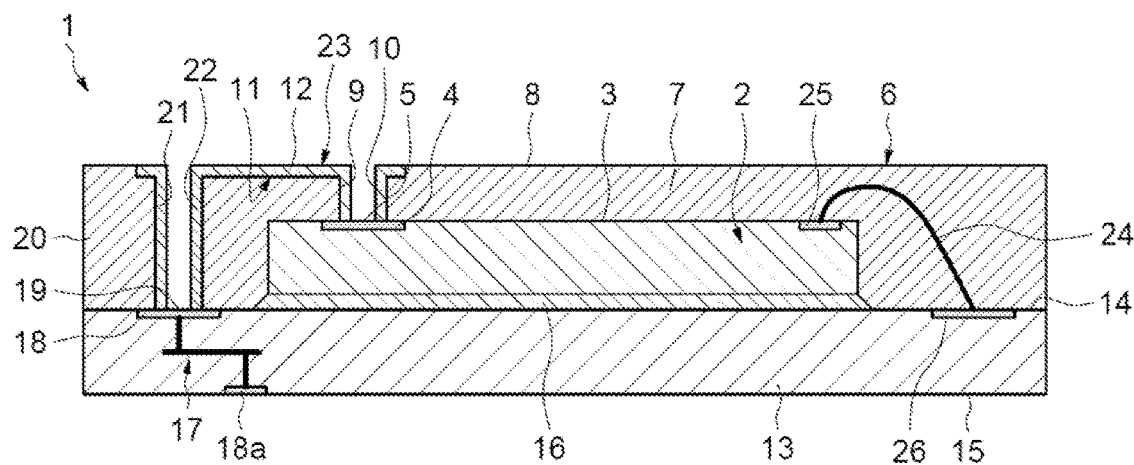
FIG. 1 shows a section through one electronic device.
Figure 2:
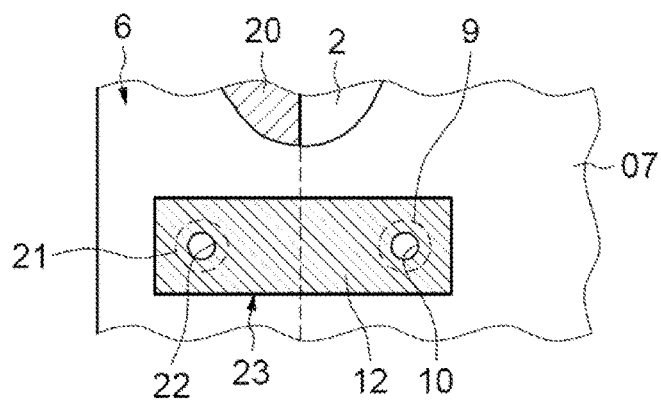
FIG. 2 shows a local view from above of the electronic device of FIG. 1.

An electronic device 1 illustrated in FIGS. 1 and 2 comprises an integrated circuit chip 2 that has a front face 3 provided with at least one electrical connection pad 4 that has a front face 5.

The electronic device 1 comprises an overmolded encapsulation block 6 for encapsulating the integrated circuit chip 2 that comprises a front layer 7 at least partially covering the front face 3 of the integrated circuit chip 2. The encapsulation block 6 has a front face 8.

The front layer 7 of the encapsulation block 6 has a through-hole 9 located above the pad 4. At least part of the periphery of the edge of the hole 9, located on the integrated circuit chip 2 side, is located above and is adjacent to the front face 5 of the pad 4 of the integrated circuit chip 2. In other words, the front layer 7 of the encapsulation block 6 partially covers the front face 5 of the front pad 4 at its outer periphery. For example, the through-hole 9 is inscribed in the front face 5 of the pad 4.

The wall of the through-hole 9 is covered with an inner metal layer 10 that is joined to (physically in contact with) the front pad 4 of the integrated circuit chip 2 so as to form an electrical connection.

A grooved local zone 12 of the front face 8 of the front layer 7, running up to the front edge of the through-hole 9, is covered with a local front metal layer 12 that is joined to (physically in contact with) the inner metal layer 10 so as to form an electrical connection. Advantageously, the front metal layer 12 is connected to the front periphery of the inner metal layer 10.

The overmolded encapsulation block 6 comprises a plastic material, for example a resin, that contains additive particles dispersed throughout the material. Now, the additive particles that are located in a surface portion of the wall of the hole 9 and in a surface portion of the front zone 11 are activated and comprise metal grains for attaching or anchoring the inner metal layer 10 and the front metal layer 12 to the encapsulation block 6.

One mode of fabrication of the electronic device 1 comprises the following steps.

The integrated circuit chip 2 is placed in a mold so as to form a molding cavity corresponding to the encapsulation block 6 to be produced.

A liquid plastic material, for example a thermosetting resin, is injected into the cavity of the mold. This liquid plastic material contains electrically nonconductive additive particles in suspension, on which the laser direct structuring (LDS) technique may be implemented.

Once the material has set, a solid encapsulation block 6 is obtained, the front layer 7 of which runs or extends over the front pad 4 of the integrated circuit chip 2. The additive particles are then dispersed throughout and included within the solid plastic material.

Next, once the device has been removed from the mold, the solid material is attacked under the effect of laser radiation so as to form the through-hole 9 and a groove in the front zone 11. In so doing, under the effect of the laser radiation, the additive particles of the surface portion of the hole 9 and of the surface portion of the grooved front zone 11 are activated so as to allow active metal grains to appear.

Next, the device is immersed in a metal bath. The metal of the metal bath is attached or anchored to the activated additive particles of the wall of the hole 9 and of the front zone 11 so as to form, locally, the inner metal layer 10 and the front metal layer 12.

Once out of the metal bath, the electronic device 1 is directly obtained.

More specifically, according to one exemplary embodiment illustrated in FIGS. 1 and 2, the electronic device 1 comprises a carrier substrate 13 that has a front face 14 and a back face 15.

The integrated circuit chip 2 is attached to the top of the front face 14 of the carrier substrate 13 via an adhesive layer 16, the integrated circuit chip 2 covering a central zone of the front face 14.

The carrier substrate 13 is provided with a network 17 of electrical connections from one face to the other and comprises an electrical connection pad 18 in the front face 14, which pad is located a certain distance away from the periphery of the integrated circuit chip 2 and has a front face 19.

The encapsulation block 6 comprises the front layer 7 and an annular peripheral portion 20 that runs around the periphery of the integrated circuit chip 2, on top of the peripheral zone of the front face 14 of the carrier substrate 13 and joined to the front layer 7. The front face 8 of the encapsulation block 6 is flat and parallel to the carrier substrate 13.

The peripheral portion 20 of the encapsulation block 6 has a through-hole 21 located above the pad 18. This through-hole 21 is located with respect to the pad 18 of the carrier substrate 13 in a manner equivalent to the location, described above, of the hole 9 with respect to the pad 4 of the integrated circuit chip 2.

The wall of the through-hole 21 is covered with an inner metal layer 22 that is joined to the front pad 18 of the carrier substrate 13 so as to form an electrical connection.

The grooved local zone 11 of the front face 8 of the encapsulation block 6 runs up to the front edge of the through-hole 21 and the front metal layer 12 is joined to the inner metal layer 22 so as to form an electrical connection.

Thus, the front pad 4 of the integrated circuit chip 2 and the front pad 18 of the network of electrical connections 17 are connected by an electrical connection 23 comprising the inner metal layers 9 and 22 and the front metal layer 12, this front layer 12 constituting a front track.

One mode of fabrication of the electronic device 1 thus formed comprises steps that are equivalent to those described above for the purpose of forming this electrical connection 23.

The electronic device 1 may comprise a plurality of electrical connections 23 connecting other front pads of the integrated circuit chip to other front pads of the network of electrical connections 17 of the carrier substrate 13.

According to one variant embodiment, also illustrated in FIG. 1, the electronic device 1 may further comprise a plurality of electrical wires (bonding wires) 24 that are embedded in the encapsulation block 6 when the constituent material of this encapsulation block is injected, and which connect other front pads 26 of the integrated circuit chip 2 to other front pads 27 of the network of electrical connections 17 of the carrier substrate 13.

The electronic device 1 may be mounted on top of a printed circuit board (not shown) via electrical connection elements (not shown) placed on back pads 18 of the network of electrical connections 17 that are located in the back face 15 of the carrier substrate 13.

Figure 3:
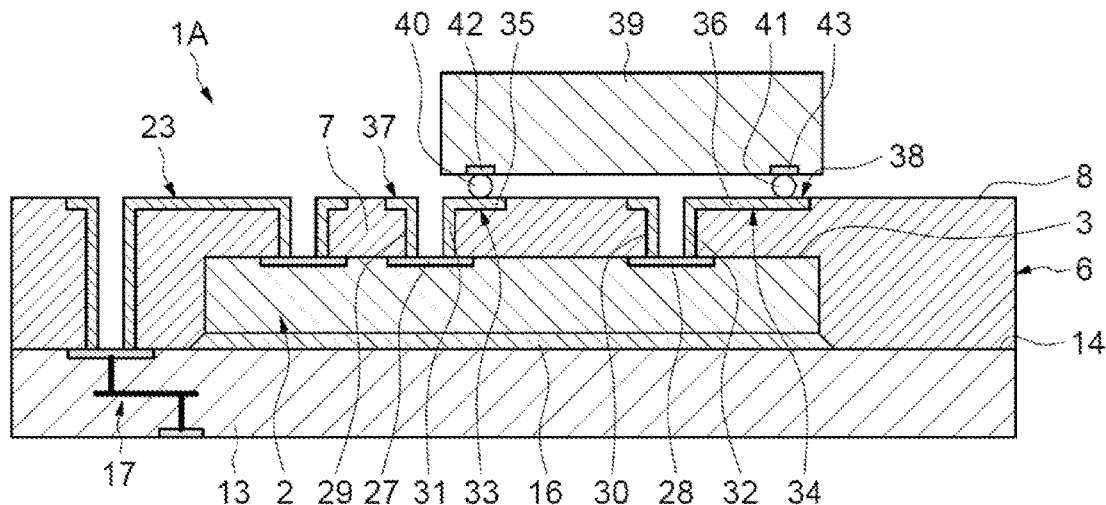
FIG. 3 shows a section through another electronic device.

According to one variant embodiment illustrated in FIG. 3, an electronic device 1A comprises an integrated circuit chip 2 that is bonded to a carrier substrate 13.

The front face 3 of the integrated circuit chip 2 is provided with front electrical connection pads 27 and 28.

A front layer 7 of an overmolded encapsulation block 6 has through-holes 29 and 30 that are located above the front pads 27 and 28, in a manner equivalent to that described above in FIGS. 1-2.

The walls of the holes 29 and 30 are covered with the inner metal layers 31 and 32, which are joined to the pads 27 and 28.

Grooved front local zones 33 and 34 of the front face 8 of the front layer 7 of the encapsulation block 6, running up to the front edges of the through-holes 29 and 30, respectively, are covered with local front metal layers 35 and 36, which are joined to the inner metal layers 31 and 32, respectively.

The inner metal layers 31 and 32 and the front metal layers 35 and 36 form electrical connections 37 and 38, which are produced in a manner equivalent to that described above in FIGS. 1-2.

According to one variant embodiment, the electronic device 1A comprises an additional electronic component 39, such as a discrete component (passive or active), an integrated circuit chip or a specific electronic package, which is mounted on top of the front layer 7 of the encapsulation block 6 via electrical connection elements 40 and 41 that are interposed between the front metal layers 35 and 36 and pads 42 and 43 of the additional component 39, such that the integrated circuit chip 2 and the additional component 39 are connected.

A plurality of electrical connections 37 and 38 and of electrical connection elements 40 and 41 may be provided to connect the integrated circuit chip 2 and the additional component 39.

The electronic device 1A comprises an electrical connection 23 and/or electrical wires 24 (see, FIG. 2), or a plurality of electrical connections 23 and/or of electrical wires 24, such that the integrated circuit chip 2 is connected to the network of electrical connections 17 of the carrier substrate 13, in a manner equivalent to that described above.

According to one variant embodiment (not shown), the second integrated circuit chip 39 could later be embedded in an additional encapsulation layer formed on top of the front face 8 of the encapsulation block 6.

According to one variant embodiment (not shown), the second integrated circuit chip 39 being absent or located elsewhere above the integrated circuit chip 2, at least one of the local front metal layers 35 and 36, or a plurality of such local front metal layers, could be connected to front pads of the network of electrical connections 17 of the carrier substrate 13 via electrical wires that are located outside the encapsulation block 6.

Figure 4:
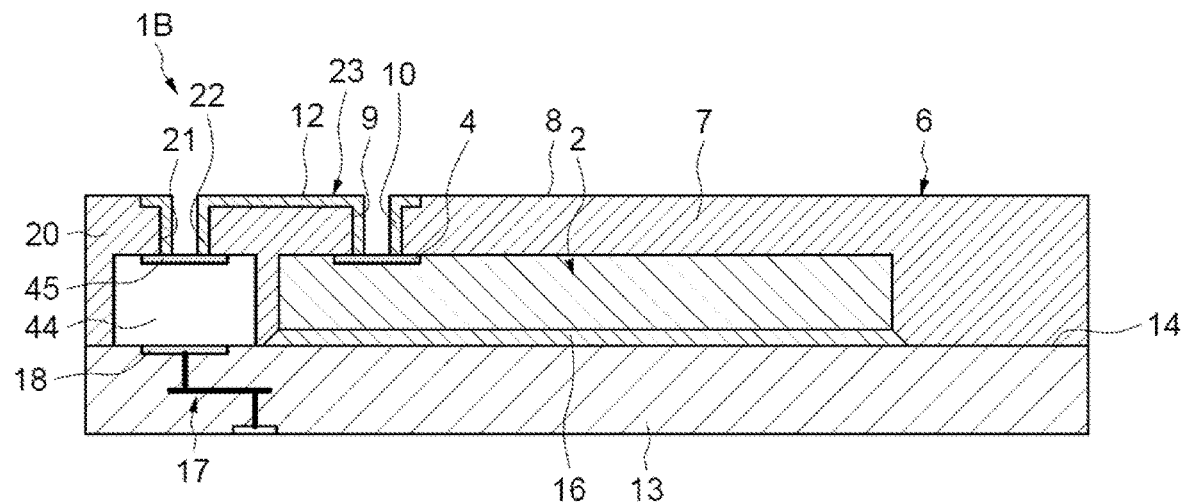
FIG. 4 shows a section through another electronic device.

According to one exemplary embodiment illustrated in FIG. 4, an electronic device 1B comprises an additional electronic component 44, such as a discrete component (passive or active) or an integrated circuit chip, which is mounted on top of the front face 14 of the carrier substrate 13, a certain distance away from the integrated circuit chip 2, and which is embedded in the encapsulation block 6.

The electronic component 44 is connected to the network of electrical connections 17 of the carrier substrate 13 via intermediate electrical connection elements and/or electrical wires.

The electrical connection 23 is modified such that the through-hole 22 is formed above a front pad 45 of the additional electronic component 44 and the inner layer 22 is connected to this front pad 45. Thus, the integrated circuit chip 2 and the electronic component 44 are connected via the electrical connection 23 formed in this way. The integrated circuit chip 2 and the electronic component 44 could be connected via a plurality of electrical connections 23 formed in this way.

Figure 5:
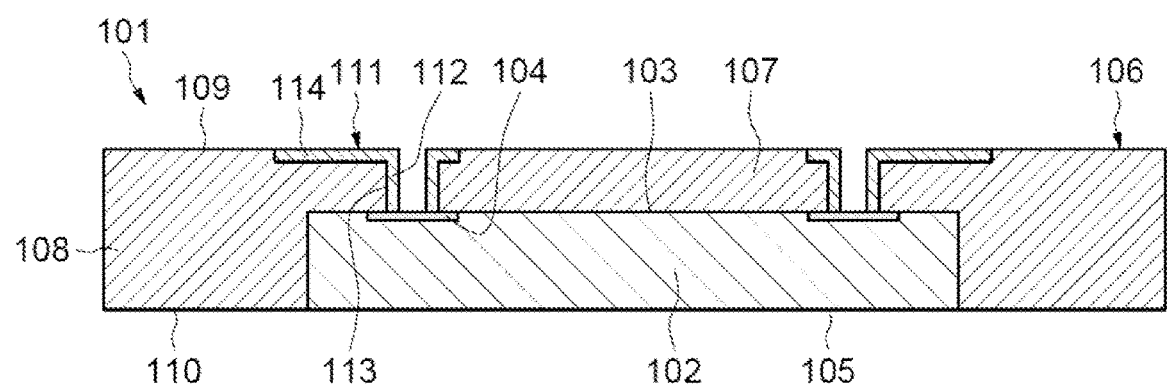
FIG. 5 shows a section through another electronic device.

According to one exemplary embodiment illustrated in FIG. 5, an electronic device 101 comprises an integrated circuit chip 102 that has a front face 103 provided with a plurality of electrical connection pads 104 and a back face 105.

The integrated circuit chip 102 is embedded in an overmolded encapsulation block 106 that comprises a front layer 107 running over the face 103 of the integrated circuit chip 102 and an annular portion 108 surrounding the periphery of the integrated circuit chip 102, such that the encapsulation block 106 has a front face 109 that is parallel to the faces 103 and 105 of the integrated circuit chip 102 and an annular back face 110 that is located in the plane of the back face 105 of the integrated circuit chip 102.

The encapsulation block 106 is provided with a plurality of electrical connections 111, which are formed by attacking the encapsulation block 106 by laser means, as described above.

Each electrical connection 111 comprises an inner metal layer 112 that covers the wall of a through-hole 113, through the front layer 107 of the encapsulation block 106, and is connected to a front pad 103 of the integrated circuit chip 102 and comprises a local front metal layer 114 that covers a grooved local zone 115 of the front face 109 of the encapsulation block 106 and is connected to the inner metal layer 112.

The electronic device 201 may be mounted on top of a printed circuit board (not shown) via electrical connection elements (not shown) placed on the local front metal layers 114 of the electrical connections 111.

According to variant embodiments, electronic devices may comprise combinations of the various electrical connections described in the above exemplary and variant embodiments and combinations of several encapsulation layers on top of one another, provided with combinations of electrical connections comprising inner and front metal layers.

The invention claimed is:

1. A process for fabricating an electronic device, comprising:
    placing an integrated circuit chip in a mold, the integrated circuit chip having a front face provided with an electrical connection pad;
    injecting a material into the mold, wherein the material comprises additive particles that are activatable in response to laser radiation;
    curing the material injected into the mold to produce an overmolded device including an encapsulation block comprising a layer at least partially covering said front face of the integrated circuit chip;
    removing the overmolded device from the mold;
    making a through-hole in the layer of the encapsulation block above the electrical connection pad of the integrated circuit chip;
    applying laser radiation to activate the additive particles to form active metal grains that are located at a wall of the through-hole and in a local zone of a front face of the layer adjacent to the through-hole; and
    producing, in a metal bath, a metallization phase so as to form an inner metal layer that is attached or anchored to the active metal grains at the wall of the through-hole and connected to the electrical connection pad of the integrated circuit chip, and a local front metal layer that is attached or anchored to the active metal grains at the local zone of the front face of the layer of the encapsulation block, said local front metal layer being connected to the inner metal layer of the through-hole.

2. The method of claim 1, further comprising mounting the integrated circuit chip to a front face of a carrier substrate, and wherein placing comprises placing the integrated circuit chip mounted to the carrier substrate in the mold.

3. The method of claim 2, wherein the encapsulation block further comprises an annular peripheral portion that runs around a periphery of the integrated circuit chip above the front face of the carrier substrate.

4. The method of claim 3, further comprising:
making a further through-hole in the annular peripheral portion of the encapsulation block;
applying laser radiation to activate the additive particles that are located at a wall of the further through-hole to form active metal grains; and
producing, in the metal bath, the metallization phase so as to form a further inner metal layer that is attached or anchored to the active metal grains at the wall of the further through-hole.

5. The method of claim 4, wherein said further inner metal layer is connected to the local front metal layer.

6. The method of claim 4, wherein making the further through-hole comprises extending the further through-hole to reach a pad on the front surface of the carrier substrate, and wherein the further inner metal layer is connected to said pad on the front surface.

7. The method of claim 4, wherein making the further through-hole comprises extending the further through-hole to reach a pad of an electrical component mounted to the front surface of the carrier substrate, and wherein the further inner metal layer is connected to the electrical component.

8. The method of claim 4, wherein mounting the integrated circuit chip to the front face of a carrier substrate further comprises installing a bonding wire electrically connecting a further electrical connection pad of the integrated circuit chip to the carrier substrate.

9. The method of claim 8, wherein the encapsulation block encapsulates said bonding wire.

10. The method of claim 1, further comprising attaching an electronic component to the encapsulation block, wherein an electrical connection pad of the electronic component is electrically connected to the local front metal layer.

* * * * *